United States Patent
Freeland

Patent Number: 5,831,831
Date of Patent: Nov. 3, 1998

[54] BONDING MATERIAL AND PHASE CHANGE MATERIAL SYSTEM FOR HEAT BURST DISSIPATION

[75] Inventor: Mark Freeland, Farmington Hills, Mich.

[73] Assignee: Ford Motor Company, Dearborn, Mich.

[21] Appl. No.: 826,323

[22] Filed: Mar. 27, 1997

[51] Int. Cl.[6] .................................................. H05K 7/20
[52] U.S. Cl. ........................ 361/704; 361/689; 361/699; 361/700; 257/714; 257/707; 257/712; 257/713
[58] Field of Search ................................... 361/689, 697, 361/698, 700, 704, 708; 257/714, 707, 720, 716, 712, 713; 165/80.2; 174/16.3

[56] References Cited

U.S. PATENT DOCUMENTS

| | | |
|---|---|---|
| 4,602,314 | 7/1986 | Broadbent . |
| 4,661,881 | 4/1987 | Watson et al. . |
| 5,007,478 | 4/1991 | Sengupta ................................. 361/700 |
| 5,130,889 | 7/1992 | Hamburgen et al. . |
| 5,224,356 | 7/1993 | Colvin et al. .......................... 165/80.2 |
| 5,285,559 | 2/1994 | Thompson et al. .................... 174/16.3 |
| 5,315,154 | 5/1994 | Elwell ..................................... 257/707 |
| 5,323,294 | 6/1994 | Layton et al. . |
| 5,455,458 | 10/1995 | Quon et al. . |
| 5,477,409 | 12/1995 | Sayka . |
| 5,493,153 | 2/1996 | Arikawa et al. . |
| 5,561,590 | 10/1996 | Norell et al. . |

Primary Examiner—Gregory Thompson
Assistant Examiner—Boris L. Chervinsky
Attorney, Agent, or Firm—Leslie C. Hodges

[57] ABSTRACT

There is disclosed herein an electronic circuit assembly using a bonding material/phase change material system for electronic device heat burst dissipation. One embodiment of the assembly comprises: a substrate having a substrate surface with a preselected mounting site located thereon; a predetermined amount of phase change material disposed on the substrate surface at the preselected mounting site; a predetermined amount of bonding material arranged on the substrate surface at the preselected mounting site so as to substantially surround the predetermined amount of phase change material; and an electronic device having a heatspreader portion, the device being oriented such that the heatspreader portion is positioned at the preselected mounting site over the predetermined amounts of phase change material and bonding material, the heatspreader portion being attached to the substrate surface by the bonding material.

20 Claims, 2 Drawing Sheets

BONDING MATERIAL AND PHASE CHANGE MATERIAL SYSTEM FOR HEAT BURST DISSIPATION

BACKGROUND OF THE INVENTION

1. Field of the Invention

The present invention relates generally to heat dissipation for electronic devices. More particularly, the present invention relates to transient heat burst dissipation for electronic devices having heatspreaders.

2. Disclosure Information

All electronic devices generate heat as a normal part of their operation. However, when a device or its environment generates too much heat, the performance of the device can be jeopardized. In order to avoid excessively generated heat from damaging the device itself or any other components in the surrounding circuitry, it is common practice to attach a heat sink 30 to the device 10, as shown in FIG. 1. Such heat sinks typically include fins and/or other elements in order to provide a high surface area-to-volume ratio, and are typically constructed of aluminum, copper, or some other metal or alloy having a high coefficient of thermal conductance.

A heat sink controls the temperature of the device to which it is attached in two ways. First, it controls the steady-state temperature of the device by virtue of its thermal conductance as part of the heat flow path between the device and its surrounding environment. Second, it controls the temperature of the device during transient heat bursts by virtue of its heat capacity. Thus, a heat sink with a high thermal conductance (or, conversely, a low thermal resistance) will result in a low average temperature for the device, and a heat sink with a large thermal capacity will result in a low peak temperature for the device during transient thermal bursts. Heat sinks may be produced having one or the other or both of these temperature control features, depending upon its size, materials of construction, geometry, and so forth. However, achieving one or both of these thermal management features may produce certain disadvantages such as added weight, added cost, added space requirements, etc.

While many electronic devices generate a steady amount of heat output over a continuous period of operation, some devices (such as the solenoid drivers for an Antilock Braking System) operate only intermittently and produce sudden bursts of thermal output. Such devices may only be operating—and therefore producing heat—for 10 percent of the duty cycle of the system it is a part of, for example. For such a device, the remaining 90 percent of the system's duty cycle may be spent dissipating the sudden burst of heat produced during the 10 percent period. Therefore, a heat sink designed for this kind of device requires primarily a large thermal capacity, with thermal conductance being of much less concern.

One way of achieving the desired thermal capacity for such devices and their circuit assemblies is to introduce a phase change material (PCM) into the thermal stack (i.e., into the thermal path between the device and its environment). The latent heat of fusion of a PCM enables it to absorb heat rapidly and to increase the overall heat capacity of the thermal stack at the melting point temperature of the PCM material. A PCM may be chosen so that its melting point matches a selected temperature within the temperature operating range of the device to which it is attached. For example, U.S. Pat. No. 5,477,409 to Sayka, which is incorporated herein by reference, lists at column 6, lines 47–63 various PCM metal alloys and their respective melting points which may be selected for this purpose.

Prior art approaches for incorporating a PCM into a circuit assembly's thermal stack include (1) placing a PCM within the housing of the device itself, (2) burying a PCM under a device within the underlying substrate, and (3) encasing a PCM in a cavity within a conventional heat sink attached to the device. However, the first two approaches suffer the disadvantage that they are difficult and expensive to implement, while the third approach may add unnecessary weight and expense. It is desirable, therefore, to present a way of using PCMs within an electronic circuit assembly's thermal stack that does not require the added expense, weight, and difficulty involved in the foregoing approaches.

SUMMARY OF THE INVENTION

The present invention overcomes the disadvantages of the prior art by providing an electronic circuit assembly using a bonding material/phase change material system for electronic device heat burst dissipation. One embodiment of the assembly comprises: a substrate having a substrate surface with a preselected mounting site located thereon; a predetermined amount of phase change material disposed on the substrate surface at the preselected mounting site; the predetermined amount of phase change material having a top surface, a bottom surface in contact with the substrate surface, and a periphery thereabout a predetermined amount of bonding material arranged on the substrate surface at the preselected mounting site so as to substantially encircle the periphery of the predetermined amount of phase change material such that the top surface of the phase change material is exposed; and an electronic device having a heatspreader portion, the device being oriented such that the heatspreader portion is positioned at the preselected mounting site atop the predetermined amounts of phase change material and bonding material, the heatspreader portion being attached to the substrate surface by the bonding material.

It is an advantage of the present invention that a PCM may be incorporated into a circuit assembly's thermal stack in order to dissipate thermal bursts without the need of a conventional heat sink.

A further advantage is that the present invention may be used with any electronic device having a heat spreader, without requiring any special design of the device or of the associated substrate.

Yet another advantage is that the present invention may be practiced using conventional production equipment and processes.

These and other advantages, features and objects of the invention will become apparent from the drawings, detailed description and claims which follow.

DETAILED DESCRIPTION OF THE PREFERRED EMBODIMENTS

Figure 3:
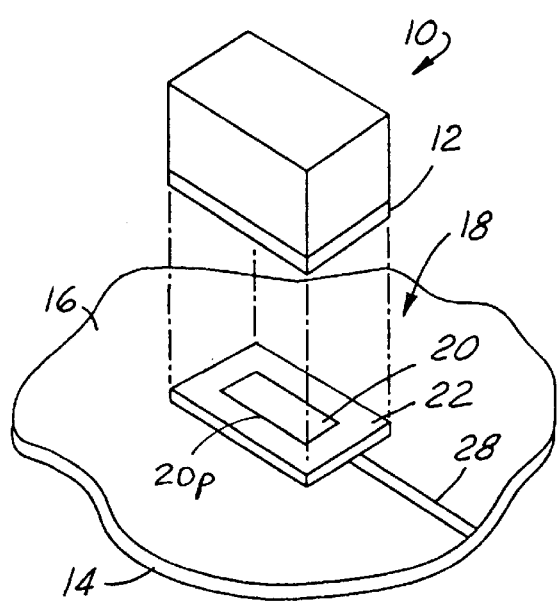
FIG. 3 is an exploded perspective view of an electronic circuit assembly according to a first embodiment of the present invention.

Referring now to the drawings, FIG. 3 shows a perspective view of a first embodiment of the present invention, wherein a substrate 14 has a substrate surface 16 with a preselected mounting site 18 located thereon. The preselected mounting site 18 for each electronic device 10 is the place on the substrate surface 16 where the device 10 is to be attached, and is determined by the circuit designer when designing the circuit board layout. Although not shown here, each electronic device 10 has one or more electrical terminations or leads which may be attached to its associated mounting pads and electrical circuit traces. As used herein, the device 10 is one which produces intermittent thermal bursts.

On a bottom surface of the device 10 is an optional heatspreader portion 12, which is typically made of metal. In the case of an integrated circuit (IC) device, the heatspreader 12 is usually directly connected to the silicon wafer within the interior of the device 10 so that heat generated by the wafer during operation may be transferred via the heatspreader 12 to the exterior of the device 10, and ultimately to some kind of heat sink. Alternatively, the heatspreader 12 may be a once-separate metallic piece that has been affixed to the exterior of the device 10 using a bonding means which is preferably (but not necessarily) thermally conductive, such as solder or metal-filled adhesive. Although it is preferable that the device 10 have a heatspreader 12, it may not be necessary in cases where the housing of the device 12 is capable of sufficient heat transfer.

Figure 1:
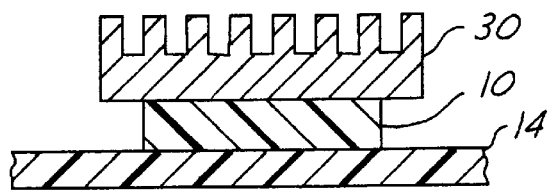
FIG. 1 is an elevational cross-section view of a conventional heat sink attached to an electronic device according to the prior art.
Figure 2:
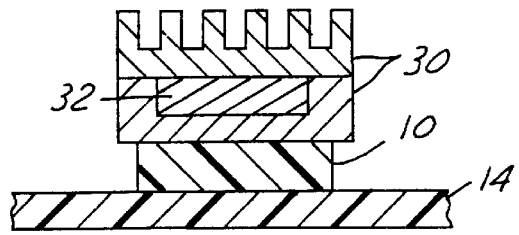
FIG. 2 is an elevational cross-section view of a conventional heat sink containing a PCM attached to an electronic device according to the prior art.

In order to absorb and dissipate intermittent thermal bursts, conventional thermal management practice would be to introduce a PCN 32 into the device's thermal stack by attaching a heat sink 30 containing a PCM 32 onto the device 10, as illustrated in FIG. 2. However, the present invention eliminates the need for attaching an external heat sink 30 to the device 10 by using the already existing bonding material 22, which is typically the means used to affix the device 10 and/or its heatspreader 12 to the substrate surface 16 (or to a mounting pad on the substrate 16), as a kind of barrier within which a predetermined amount of PCM 20 may be contained.

PCMs 20 may be selected from a wide range of materials, such as organic waxes and paraffins, inorganic multiphase metal alloys, eutectic salts, and other materials well known in the art to which the present invention pertains. Before selection of a specific PCM 20, it must be determined what the desired PCM melting point will be and how much heat the total volume of PCM will have to absorb. Given this information, as well as other factors such as availability and cost, a particular PCM 20 may be chosen and the total volume of PCM needed may be calculated.

Figure 4:
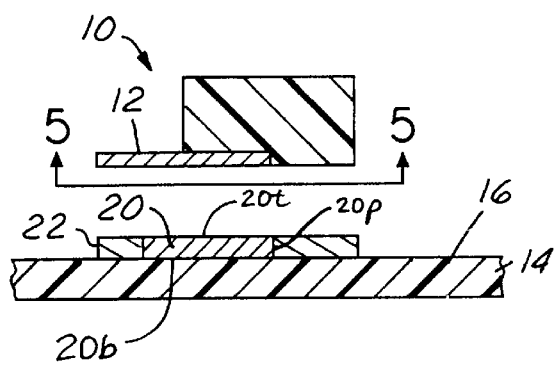
FIG. 4 is an elevational cross-section view of the present invention showing an alternatively configured electronic device.

As illustrated in FIG. 3, a predetermined amount of PCM 20 is disposed on the substrate surface 16 at the preselected mounting site 18. This amount is "predetermined" in that it is the quantity of PCM 20 needed to provide the amount of thermal absorption required for its associated device 10. As shown in FIGS. 3–4, the PCM 20 has a top surface 20t, a bottom surface 20b in contact with the substrate surface 16, and a periphery 20p thereabout. Additionally, a predetermined amount of bonding material 22 is arranged on the substrate surface 16 at the mounting site 18 so as to substantially surround the PCM 20. The amount of bonding material 22 is "predetermined" in that its outer perimeter will generally conform to the outer perimeter of the footprint (i.e., bottom face) of the heatspreader 12 or of the entire device 10; given the outer perimeter dimensions, the amount of PCM 20 required, and the respective thicknesses to which the PCM 20 and bonding material 22 are to be deposited, the amount of bonding material 22 can be calculated.

Figure 6:
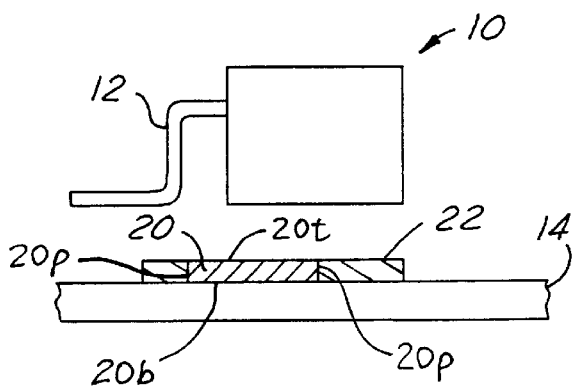
FIG. 6 is an elevational cross-section view of the present invention showing another alternatively configured electronic device.

When the bonding material 22 and PCM 20 are deposited onto the substrate surface 16, each will be arranged in a given geometric configuration. (As used herein, the "configurations" of the bonding material 22 and PCM 20 refer to the respective two-dimensional geometric shapes that these amounts are arranged in as deposited on the substrate surface 16, as viewed from above and irrespective of the depth to which each is deposited.) As mentioned above, the configuration of the bonding material 22 will have its outer perimeter generally conforming to the outer perimeter 20p of the footprint of the heatspreader 12 or of the entire device 10. The PCM 22 is arranged within the outer perimeter of the bonding material 22, and its own outer perimeter 20p may be a smaller, substantially concentric version of the bonding material's outer perimeter. (However, it may of course be arranged in other configurations.) Whatever specific configuration is selected, the predetermined amount of bonding material 22 should be arranged on the substrate surface 16 at the preselected mounting site 18 so as to substantially encircle the periphery 20p of the predetermined amount of phase change material 20 in such a way that that the top surface 20t of the material 20 is exposed, as shown in FIGS. 3, 4 and 6. The predetermined configuration and amount of PCM 20 may be applied first, followed by the predetermined configuration and amount of bonding material 22, with both applications using such means as silkscreening or dispensing; or, the order of application may be reversed.

Figure 5:
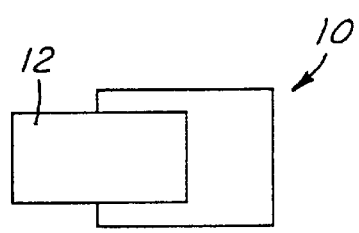
FIG. 5 is a bottom plan view of the electronic device of FIG. 4 taken along section line 5—5.

When a heatspreader 12 is used, it may form the entire footprint of the device 10, as illustrated in FIG. 3, or it may form only a portion of the entire footprint of the device, as illustrated in FIGS. 4 and 5. Other configurations of heatspreader/device footprints exist and are well known in the art, such as that shown in FIG. 6. Whichever configuration is given, the bonding material/PCM deposition will generally conform with at least the footprint of the heatspreader 12, but may be expanded to include some or all of the remaining non-heatspreader portion of the device footprint, as variously illustrated in FIGS. 3, 4 and 6.

Once the bonding material 22 and PCM 20 have been deposited on the substrate surface 16 at the preselected mounting site 18, the device 10 may be oriented such that its bottom surface/heatspreader 12 is positioned at the preselected mounting site 18 over the PCM 20 and bonding material 22. Then the bonding material 22 may be activated, thereby attaching the bottom surface/heatspreader 12 to the substrate surface 16 via the bonding material 22. (For example, if the bonding material 22 is a solder, the activation may entail heating, reflowing, and cooling the solder. Likewise, if the bonding material 22 is a heat-curing adhesive, the activation may entail heating, curing, and cooling the adhesive. As yet another example, if a UV-curing adhesive is used, the activation may entail exposing the adhesive to sufficient UV radiation for a given time. Other bonding materials 22 and their associated modes of activation may also be used.) Alternatively, in arrangements where a heatspreader mounting pad is attached to the substrate surface 16, wherein the bonding material 22 and PCM 20 are deposited on top of the mounting pad, the above-mentioned heating and cooling would result in the device 10 being attached via the bonding material 22 to the mounting pad, rather than to the substrate surface 16.

A circuit trace 28 may also be attached to the bonding material 22, PCM 20, and/or heatspreader mounting pad, as illustrated in FIG. 3. When the bonding material 22, PCM 20, and/or heatspreader mounting pad is/are electrically conductive, the circuit trace 28 may be electrically connected to the heatspreader 12, wherein the heatspreader 12 may in turn be utilized as an electrically conductive path to the internal circuitry of the device 10. For example, the heatspreader 12 may be attached to a silicon wafer within the device 10 and may serve as a ground lead for the wafer's circuitry. Regardless of whether there is an electrical connection between the circuit trace 28 and the device 10, the circuit trace may serve as a thermal conduit into which heat may pass from the device 10.

Although not shown in FIGS. 3, 4 and 6, a heatspreader mounting pad may be attached to the substrate surface 16 at the preselected mounting site 18. Such mounting pads may be used, for example, when the bonding material 22 is a metallic solder, since it may be difficult to attach the device 10 via solder to the non-metallic substrate surface 16. The mounting pad may be made out of metal (e.g., copper), but may also be made out of ceramic or other materials. Heatspreader mounting pads may also be used when the bonding material 22 is not a solder (e.g., an adhesive). Generally, such mounting pads would conform in perimeter with the bonding material 22, but may be larger or smaller as desired.

Figure 7:
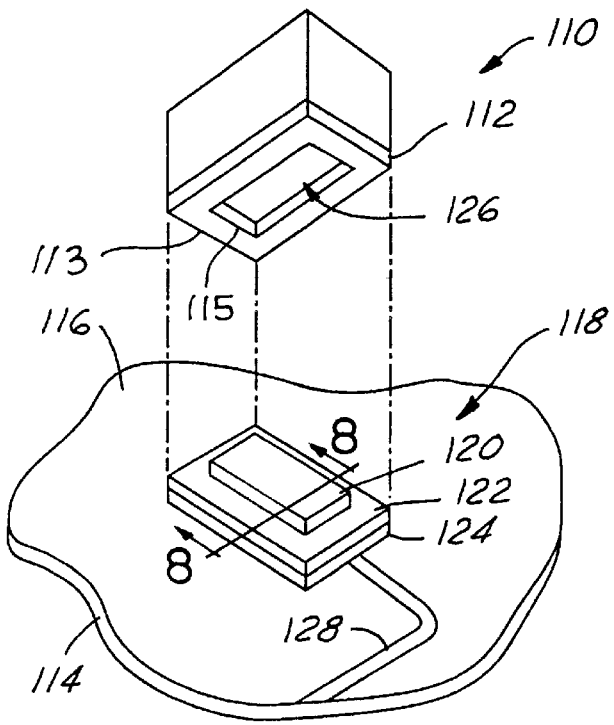
FIG. 7 is an exploded perspective view of a second embodiment of the present invention.
Figure 8:
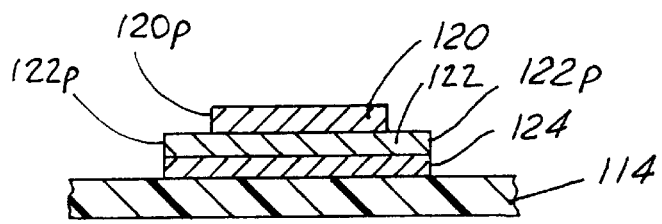
FIG. 8 is an elevational cross-section view of the present invention taken along section line 8—8 of FIG. 7.

A second embodiment of the present invention is illustrated in FIG. 7. In this embodiment, the bottom surface/heatspreader portion 112 of the device 110 is generally flat with a perimeter 113 thereabout and has a recess 126 formed on the bottom (footprint) surface 112 such that the edges 115 of the recess 126 are spaced apart from the bottom perimeter 113 of the device 110. When the device 110 includes a heatspreader 112, the recess 126 may extend through the heatspreader 112 to the bottom surface of the non-heatspreader portion of the device 110, or it may extend to a depth less than that of the heatspreader 112. If no heatspreader 112 is used, then the recess 126 is formed in the bottom surface of the device 110. The dimensions of this recess 126 will be determined by how much PCM 120 is needed to provide the required thermal capacity for the intermittently heat-bursting device 110. This predetermined amount of PCM 120 is deposited at a preselected mounting site 118 atop a deposition of bonding material 122. Note that whereas in the first embodiment the PCM 20 was disposed amid the surrounding bonding material 22, in the present embodiment the PCM 120 is disposed atop the bonding material 122 within (and non-contiguous with) its periphery 122p as shown in FIGS. 7 and 8. The deposition of phase change material 120 should have a top surface area less than the top surface area of the bonding material 122, and should also have a periphery 120p with edges spaced apart from adjacent edges of the bonding material periphery 122p.

Once the bonding material 122 has been deposited onto the substrate surface 116 and the PCM 120 deposited atop the bonding material 122, the device 110 may be oriented such that its bottom surface/heatspreader 112 is positioned at the preselected mounting site 118 atop and in contact with the PCM 120 and bonding material 122, such that the PCM 120 is received within the heatspreader/bottom surface recess 126. Then the bonding material 122 may be activated (as described above), thereby attaching the bottom surface/heat-spreader 112 to the substrate surface 116 via the bonding material 122.

Figure 9:
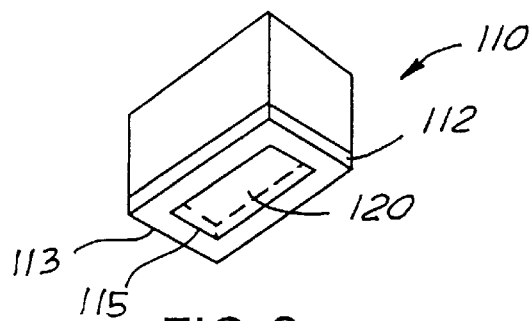
FIG. 9 is a perspective view of an electronic component according to an alternative of the second embodiment of the present invention.

Alternatively, rather than depositing the PCM 120 atop the deposition of bonding material 122, the PCM 120 may be deposited within the device's recess 126, prior to the device 110 being oriented atop and in contact with the bonding material 122. This is illustrated in FIG. 9, where the device's recess 126 is shown to be at least partially filled with a predetermined amount of PCM 120. Once the device 110 is placed atop the bonding material 122, the PCM 120 is effectively contained by the recess walls 115 and the top surface of the bonding material 122, at which point the bonding material 122 may be heated so as to be reflowed or activated, thereby attaching the device 110 to the substrate surface 116.

Similar to the first embodiment, the present embodiment may include a heatspreader mounting pad 124 attached to the surface 116 of the substrate 114, as well as a circuit trace 128 connected to the bonding material 122, PCM 120, and/or mounting pad 124.

Various other modifications to the present invention will, no doubt, occur to those skilled in the art to which the present invention pertains. For example, it is possible that a given device 10 may have more than one deposition of PCM 20 within a single deposition of bonding material 22. Also, it is possible to use a combination of the two embodiments in that a recessed heatspreader device 110 as in the second embodiment may be used with a bonding material/PCM deposition as in the first embodiment, with the further modification that the PCM 20 is deposited to a height greater than that of the surrounding bonding material 22. Furthermore, it is possible that the initial deposition of bonding material 22 may have an outer perimeter significantly larger than that of the mounting pad onto which it is deposited (i.e., the bonding material 22 may be overprinted). It is the following claims, including all equivalents, which define the scope of the invention.

I claim:

1. An electronic circuit assembly, comprising:
    a dielectric substrate having a substrate surface with a preselected mounting site located thereon;
    a predetermined amount of phase change material disposed on said substrate surface at said preselected mounting site, said predetermined amount of phase change material having a top surface, a bottom surface in contact with said substrate surface, and a periphery thereabout; and
    a predetermined amount of bonding material arranged on said substrate surface at said preselected mounting site so as to substantially encircle the periphery of said predetermined amount of phase change material such that said top surface of said phase change material is exposed,
    wherein said bonding material is a reflowable solder or curable adhesive capable of bonding said substrate surface to a bottom surface of an electronic component.

2. An electronic circuit assembly according to claim 1, further including an electronic device having a bottom surface, said device being oriented such that said bottom surface is positioned at said preselected mounting site over said predetermined amounts of phase change material and bonding material, said bottom surface being attached to said substrate surface by said bonding material.

3. An electronic circuit assembly according to claim 2, wherein said electronic device has a heatspreader portion on said bottom surface, said device being oriented such that said heatspreader portion is positioned at said preselected mounting site over said predetermined amounts of phase change material and bonding material, said heatspreader portion being attached to said substrate surface by said bonding material.

4. An electronic circuit assembly according to claim 1, wherein said bonding material is an adhesive.

5. An electronic circuit assembly according to claim 3, further including a heatspreader mounting pad affixed on said substrate surface at said preselected mounting site, said heatspreader portion of said electronic device being attached to said heatspreader mounting pad by said bonding material.

6. An electronic circuit assembly according to claim 5, wherein said bonding material is selected from the group consisting of a reflowable solder and an adhesive.

7. An electronic circuit assembly according to claim 5, wherein said heatspreader mounting pad is a copper metallization.

8. An electronic circuit assembly according to claim 1, wherein said phase change material is selected from the group consisting of organic waxes, organic paraffins, eutectic salts, and multiphase metal alloys.

9. An electronic circuit assembly according to claim 1, wherein said bonding material has a melting point higher than a melting point of said phase change material.

10. An electronic circuit assembly according to claim 1, wherein said phase change material has a melting point at a preselected temperature within a temperature operating range of said electronic device.

11. An electronic device having a generally flat bottom surface with a perimeter thereabout and a recess formed in said surface such that the edges of the recess are spaced apart from said perimeter, said recess being at least partially filled with a predetermined amount of phase change material.

12. An electronic device according to claim 11, wherein said electronic device includes a heatspreader portion on said bottom surface, such that said recess is formed in said heatspreader portion.

13. An electronic circuit assembly, comprising:

a dielectric substrate having a substrate surface with a preselected mounting site located thereon;

a predetermined amount of bonding material arranged on said substrate surface at said preselected mounting site, said bonding material having a top surface and a bonding material periphery thereabout; and a predetermined amount of phase change material deposited on said predetermined amount of bonding material, said amount of phase change material having a top surface area less than the top surface area of said bonding material and a periphery having edges spaced apart from adjacent edges of said bonding material periphery, wherein said bonding material is a reflowable solder or curable adhesive capable of bonding said substrate surface to a bottom surface of an electronic component.

14. An electronic circuit assembly according to claim 13, further including:

an electronic device having a bottom surface with a recess formed therein;

said device being oriented such that said bottom surface is positioned at said preselected mounting site with said recess substantially containing said phase change material, said electronic device being attached to said substrate surface by said bonding material.

15. An electronic circuit assembly according to claim 14, wherein said electronic device has a heatspreader portion on said bottom surface, said device being oriented such that said bottom heatspreader portion is positioned at said preselected mounting site with said recess substantially containing said phase change material, said electronic device being attached to said substrate surface by said bonding material.

16. An electronic circuit assembly according to claim 15, further including a heatspreader mounting pad affixed on said substrate surface at said preselected mounting site, said heatspreader portion of said electronic device being attached to said heatspreader mounting pad by said bonding material.

17. An electronic circuit assembly according to claim 13, wherein said bonding material is selected from the group consisting of a reflowable solder and an adhesive.

18. An electronic circuit assembly according to claim 13, wherein said phase change material is selected from the group consisting of organic waxes, organic paraffins, eutectic salts, and multiphase metal alloys.

19. An electronic circuit assembly according to claim 13, wherein said bonding material has a melting point higher than a melting point of said phase change material.

20. An electronic circuit assembly according to claim 13, wherein said phase change material has a melting point at a preselected temperature within a temperature operating range of said electronic device.

* * * * *